US010755862B2

(12) United States Patent
Chien (10) Patent No.: US 10,755,862 B2
(45) Date of Patent: Aug. 25, 2020

(54) DEVICE FOR MANUFACTURING A MULTILAYER STACKED STRUCTURE AND METHOD FOR MANUFACTURING A THIN FILM CAPACITOR

(71) Applicant: APAQ TECHNOLOGY CO., LTD., Miaoli County (TW)

(72) Inventor: Ming-Goo Chien, Taichung (TW)

(73) Assignee: APAQ TECHNOLOGY CO., LTD., Miaoli County (TW)

( * ) Notice: Subject to any disclaimer, the term of this patent is extended or adjusted under 35 U.S.C. 154(b) by 301 days.

(21) Appl. No.: 15/887,756

(22) Filed: Feb. 2, 2018

(65) Prior Publication Data

US 2019/0115157 A1    Apr. 18, 2019

(30) Foreign Application Priority Data

Oct. 13, 2017    (TW) .............................. 106135129 A (51) Int. Cl.

| H01G 4/30 | (2006.01) |
|---|---|
| C23C 14/24 | (2006.01) |
| H01G 4/248 | (2006.01) |
| H01G 4/33 | (2006.01) |
| C23C 14/56 | (2006.01) |
| H01G 13/00 | (2013.01) |

(52) U.S. Cl.
CPC ............ *H01G 4/306* (2013.01); *C23C 14/24* (2013.01); *C23C 14/568* (2013.01); *H01G 4/248* (2013.01); *H01G 4/33* (2013.01); *H01G 13/00* (2013.01); *Y10T 29/435* (2015.01)

(58) Field of Classification Search
CPC .......... H01G 4/085; H01G 4/145; H01G 4/20; H01G 4/206; H01G 4/22; H01G 4/248; H01G 4/30; H01G 4/306; H01G 4/33; H01G 13/00; C23C 14/24; C23C 14/26; Y10T 29/43; Y10T 29/435
See application file for complete search history.

(56) References Cited

U.S. PATENT DOCUMENTS

| 6,576,523 B1 * | 6/2003 | Honda | H01G 4/005 |
| | | | 438/381 |
| 2006/0256503 A1 * | 11/2006 | Kato | H01B 3/004 |
| | | | 361/311 |
| 2017/0301468 A1 * | 10/2017 | Kim | H01G 4/2325 |

* cited by examiner

*Primary Examiner* — Peter Dungba Vo
*Assistant Examiner* — Joshua D Anderson
(74) *Attorney, Agent, or Firm* — Li & Cai Intellectual Property (USA) Office (57) ABSTRACT

The present invention provides a device for manufacturing a multi-layer stacked structure and a method for manufacturing a thin film capacitor. The method includes providing a carrier substrate, forming a plurality of first material layers and a plurality of second layers that are alternately stacked on top of one another to form a multi-layer stacked structure, and then forming two terminal electrode structures for respectively enclosing two opposite side portions of the multi-layer stacked structure. One of the first material layer and the second material layer has a plurality of conductive particles randomly distributed therein. The conductive particles are heated to form a spherical structure or a sphere-like structure with low melting point and high surface energy at a temperature that is smaller than the degradation temperature of polymers. Therefore, the dielectric constant of the multi-layer stacked structure and the thin film capacitor can be increased.

6 Claims, 12 Drawing Sheets

DEVICE FOR MANUFACTURING A MULTILAYER STACKED STRUCTURE AND METHOD FOR MANUFACTURING A THIN FILM CAPACITOR

FIELD OF THE INVENTION

The present disclosure relates to a device for manufacturing a multilayer stacked structure and a method for manufacturing a thin film capacitor, and more particularly to a device for manufacturing a multilayer stacked structure for increasing dielectric coefficient, and a method of manufacturing a thin film capacitor for increasing dielectric coefficient.

BACKGROUND OF THE INVENTION

Various applications of capacitors include home appliances, computer motherboards and peripherals, power supplies, communication products and automobiles. Capacitors such as solid electrolytic capacitors or thin film capacitors are mainly used for filtering, bypassing, rectifying, coupling, decoupling, transforming and etc. Since the thin film capacitor has the advantages of being small sized, having large electrical capacity and good frequency characteristic, it can be used as a decoupling element in power circuits. However, the conventional method for manufacturing the thin film capacitor is too complex, and the dielectric coefficient of the thin film capacitor has room for improvement.

SUMMARY OF THE INVENTION

One aspect of the present disclosure relates to a device for manufacturing a multilayer stacked structure and a method for manufacturing a thin film capacitor.

One of the embodiments of the present disclosure provides a method for manufacturing a thin film capacitor, including: providing a carrier substrate; forming a plurality of first material layers and a plurality of second material layers that are alternately stacked on top of one another and disposed on the carrier substrate to form a multilayer stacked structure; and forming two terminal electrode structures for respectively enclosing two opposite side portions of the multilayer stacked structure. More particularly, each first material layer is formed by a first material layer forming device, and each second material layer is formed by a second material layer forming device. One of the first material layer and the second material layer has a plurality of conductive particles randomly distributed therein. The conductive particles are heated to form a spherical structure or a sphere-like structure with low melting point and high surface energy at a temperature that is smaller than the degradation temperature of polymers.

Another one of the embodiments of the present disclosure provides a device for manufacturing a multilayer stacked structure, including a rotatable platform, a first material layer forming device and a second material layer forming device. The rotatable platform is used for carrying a carrier substrate. The first material layer forming device is adjacent to the rotatable platform for forming a plurality of first material layers. The second material layer forming device is adjacent to the rotatable platform for forming a plurality of second material layers. More particularly, one of the first material layer and the second material layer has a plurality of conductive particles randomly distributed therein. The conductive particles are heated to form a spherical structure or a sphere-like structure with low melting point and high surface energy at a temperature that is smaller than the degradation temperature of polymers. The first material layers and the second material layers are alternately stacked on top of one another and disposed on the carrier substrate to form the multilayer stacked structure.

Therefore, the dielectric coefficient or the dielectric constant of the multilayer stacked structure and the thin film capacitor can be increased, by matching the features of "one of the first material layer and the second material layer has a plurality of conductive particles randomly distributed therein" and "the conductive particles are heated to form a spherical structure or a sphere-like structure with low melting point and high surface energy at a temperature that is smaller than the degradation temperature of polymers".

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a device for manufacturing a multilayer stacked structure and a method for manufacturing a thin film capacitor according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

It should be understood that the definite articles like "the first," "the second" or "the third" may be used to describe various components or signals, but these components or signals should not be limited to definite articles. These definite articles are used for distinguish one component from the other component or one signal from the other signal. Besides, the phrase "or" shown in the present disclosure should be interpreted as anyone item listed in the correlated items or the combination of multiple items listed in the correlated items according to the actual conditions.

First embodiment

Referring to FIG. 1 to FIG. 8, the first embodiment of the present disclosure provides a device for manufacturing a multilayer stacked structure, including a rotatable platform R, a first material layer forming device D1 and a second material layer forming device D2.

Figure 1:
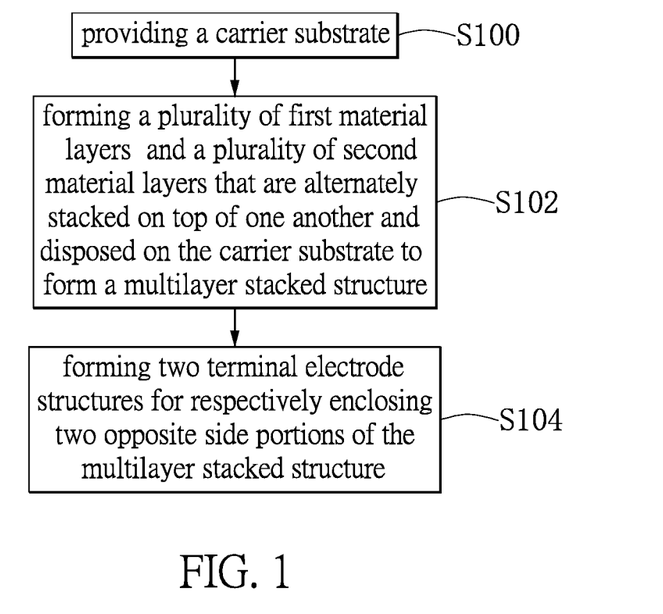
FIG. 1 shows a flowchart of a method for manufacturing a thin film capacitor according to the present disclosure.
Figure 2:
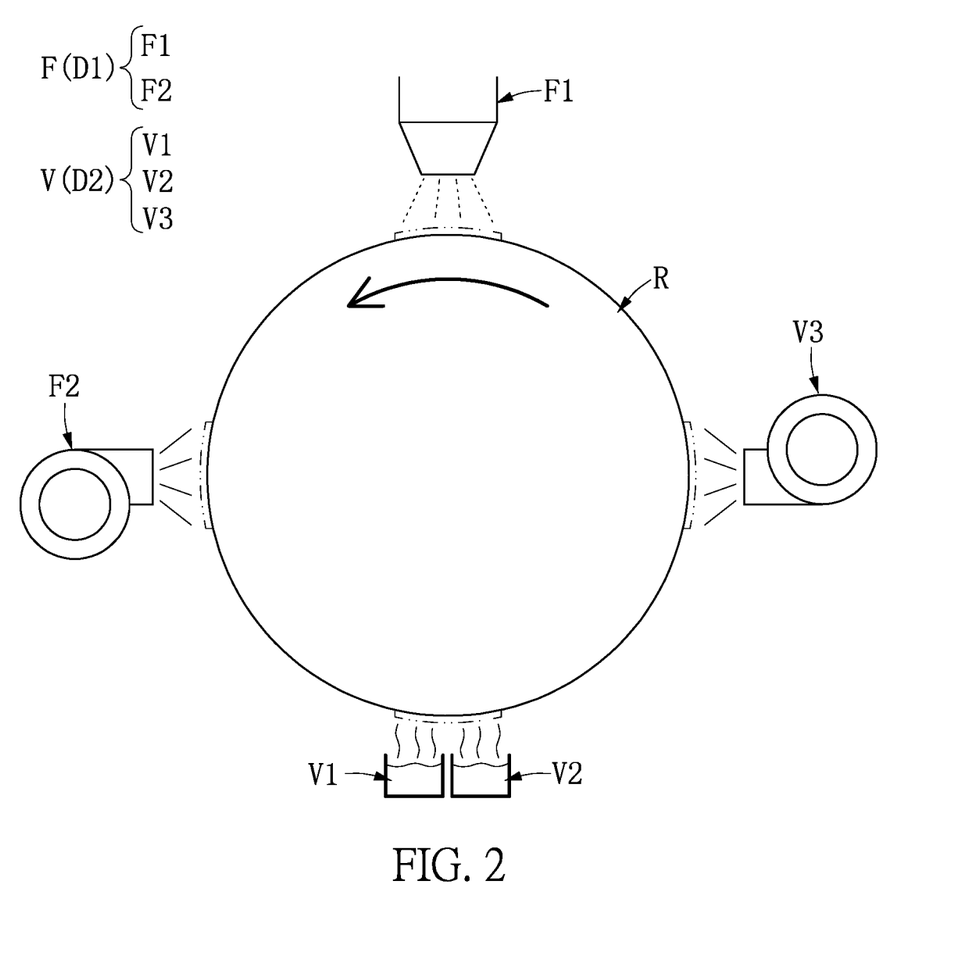
FIG. 2 shows a schematic view of a device for manufacturing a multilayer stacked structure according to a first embodiment of the present disclosure.
Figure 3:
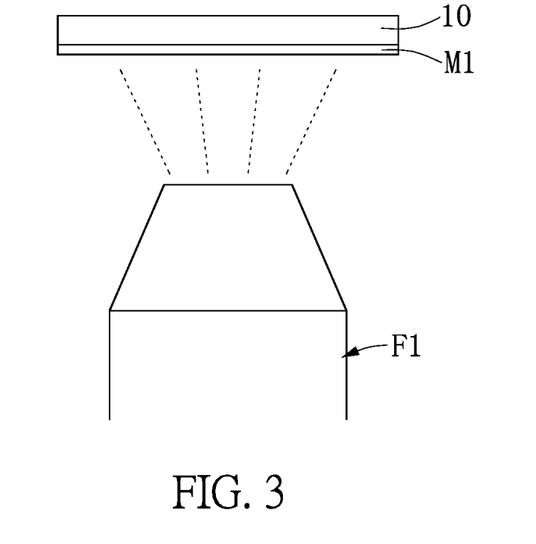
FIG. 3 shows a schematic view of the method for manufacturing the thin film capacitor for forming a metal material according to the first embodiment of the present disclosure.
Figure 4:
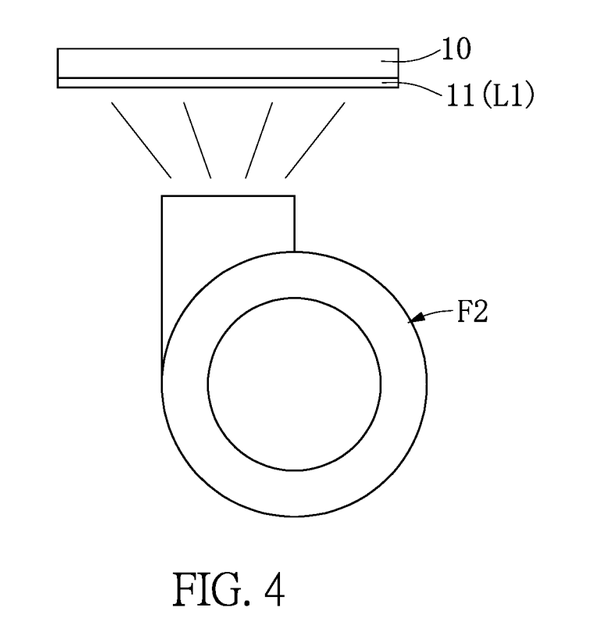
FIG. 4 shows a schematic view of the method for manufacturing the thin film capacitor for forming a metal material layer according to the first embodiment of the present disclosure.

More particularly, the rotatable platform R can be used for carrying a carrier substrate 10, the first material layer forming device D1 is adjacent to the rotatable platform R for forming a plurality of first material layers L1, and the second material layer forming device D2 is adjacent to the rotatable platform R for forming a plurality of second material layers L2. In addition, the first material layers L1 are formed by the first material layer forming device D1, the second material layers L2 are formed by the second material layer forming device D2, and one of the first material layer forming device D1 and the second material layer forming device D2 can be a co-evaporation device V. Moreover, the co-evaporation device V can concurrently provide an insulating material M2 and a conductive material M3 by co-evaporation for forming one of the first material layer L1 and the second material layer L2. Therefore, the first material layers L1 and the second material layers L2 are alternately stacked on top of one another and disposed on the carrier substrate 10 to form the multilayer stacked structure 1 as shown in FIG. 8.

For example, the device for manufacturing the multilayer stacked structure 1 can be operated either in a vacuum chamber or a non-vacuum chamber. In addition, the heating manner of the co-evaporation can be electron beam heating, high frequency inductive heating, or laser heating; but it is not meant to limit the scope of the present disclosure.

Figure 6:
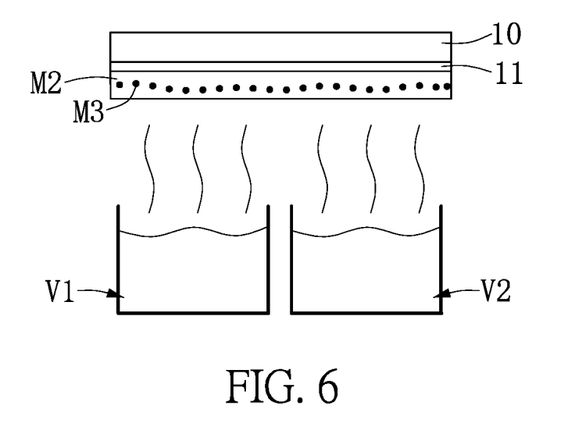
FIG. 6 shows a schematic view of the method for manufacturing the thin film capacitor for forming a second portion of the insulating material according to the first embodiment of the present disclosure.
Figure 7:
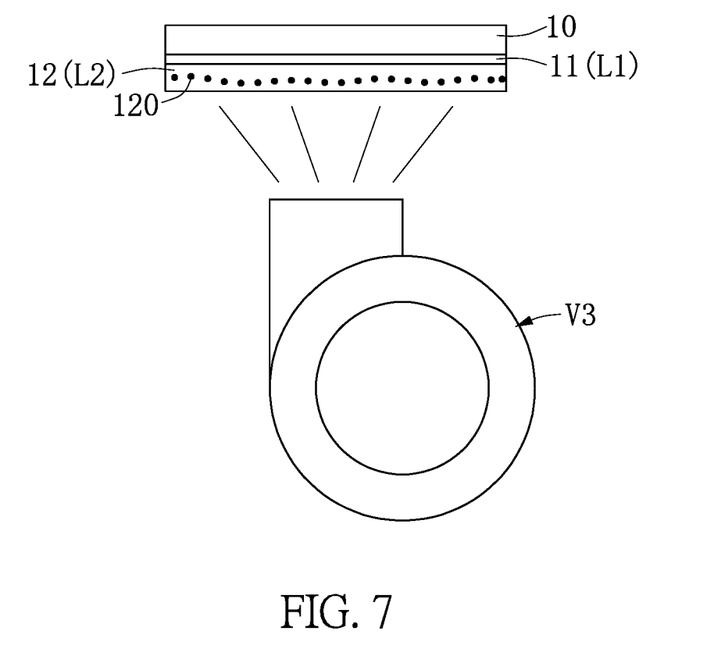
FIG. 7 shows a schematic view of the method of manufacturing the thin film capacitor for forming an insulating material layer having a plurality of conductive particles mixed therein according to the first embodiment of the present disclosure.
Figure 8:
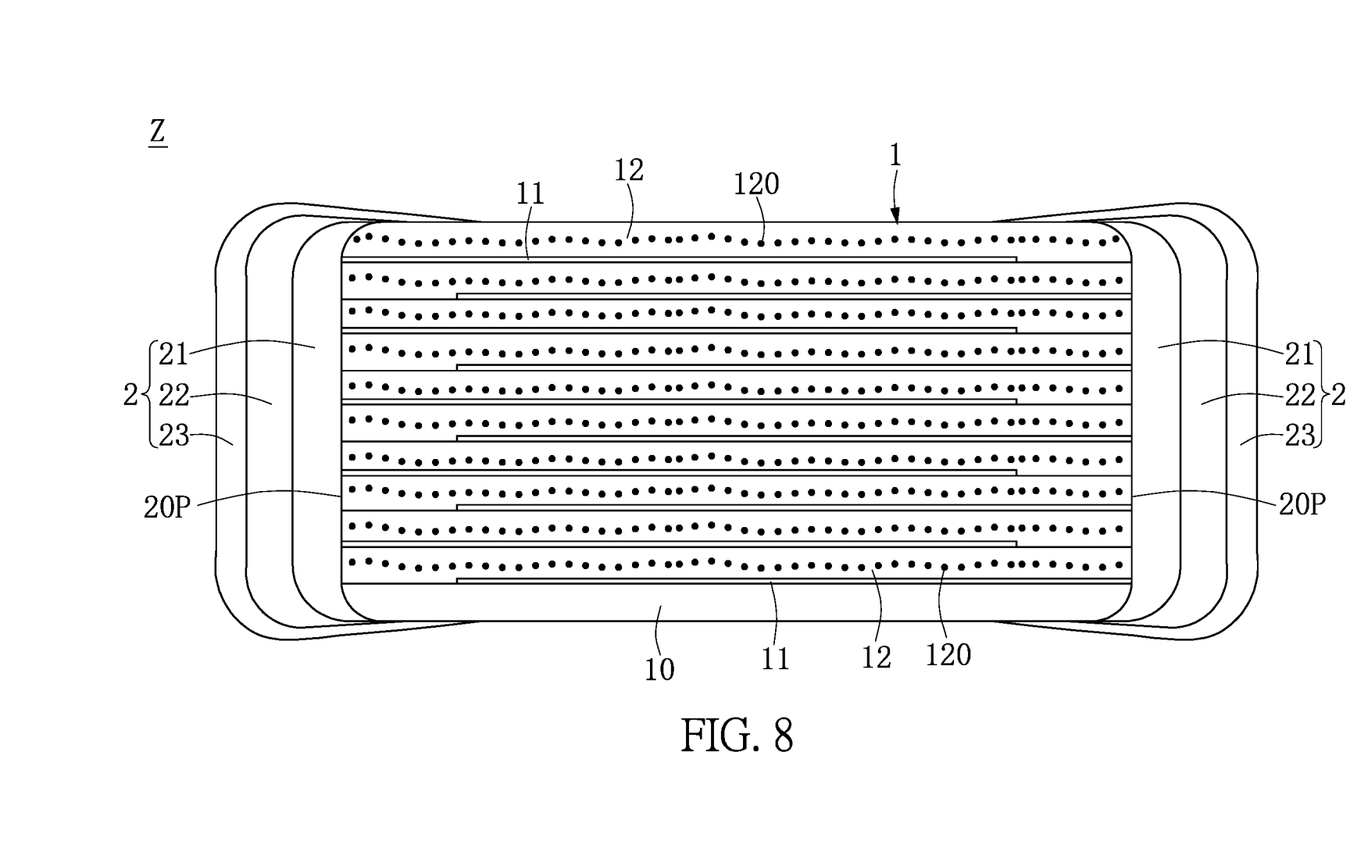
FIG. 8 shows a schematic view of the thin film capacitor according to the first embodiment of the present disclosure.

Referring to FIG. 1 to FIG. 8, the present disclosure provides a method for manufacturing a thin film capacitor, including the following steps: firstly, providing a carrier substrate 10 (S100); next, forming a plurality of first material layers L1 and a plurality of second material layers L2 that are alternately stacked on top of one another and disposed on the carrier substrate 10 to form a multilayer stacked structure 1 (S102); and then forming two terminal electrode structures 2 for respectively enclosing two opposite side portions 20P of the multilayer stacked structure 1 (S104) so as to complete the manufacture of the thin film capacitor Z as shown in FIG. 8. For example, the carrier substrate 10 may be a conductive substrate made of any type of conductive material such as Cu or Al, etc., or may be an insulating substrate made of any type of insulating material such as PMMA, PP or PET, etc.

More particularly, each first material layer L1 can be formed by a first material layer forming device D1, each second material layer L2 can be formed by a second material layer forming device D2, and one of the first material layer forming device D1 and the second material layer forming device D2 can be a co-evaporation device V. In addition, the co-evaporation device V can concurrently provide an insulating material M2 and a conductive material M3 by co-evaporation for forming one of the first material layer L1 and the second material layer L2.

For example, the first material layer L1 may be a metal material layer 11, and the second material layer L2 may be an insulating material layer 12 having a plurality of conductive particles 120 mixed therein. That is to say, the conductive particles 120 can be randomly distributed and non-uniformly arranged in the insulating material layer 12. In addition, the first material layer forming device D1 may be a metal material layer forming device F for forming the metal material layer 11, and the second material layer forming device D2 may be the co-evaporation device V. Moreover, the insulating material layer 12 can be formed by the insulating material M2 provided by the co-evaporation device V, and the conductive particles 120 can be formed by the conductive material M3 provided by the co-evaporation device V. It should be noted that the dielectric coefficient or the dielectric constant of the thin film capacitor Z and the multilayer stacked structure 1 can be increased due to the conductive particles 120 that are randomly distributed in the insulating material layer 12.

For example, the metal material layer forming device F includes a metal material forming module F1 for providing a metal material M1 and a first baking module F2 adjacent to the metal material forming module F1, and the metal material M1 can be baked or cured by the first baking module F2 to form the metal material layer 11. More particularly, referring to FIG. 2, FIG. 3 and FIG. 4, the metal material M1 (such as Cu or Al, etc.) is formed on the carrier substrate 10 by the metal material forming module F1, and then the metal material M1 is baked by the first baking module F2 to form the metal material layer 11. It should be noted that the metal material forming module F1 can generate the metal material M1 by coating, spraying or printing, but it is not meant to limit the scope of the present disclosure.

For example, the co-evaporation device V includes an insulating material evaporating module V1 for providing the insulating material M2, a conductive material evaporating module V2 for providing the conductive material M3, and a second baking module V3 adjacent to the insulating material evaporating module V1 and the conductive material evaporating module V2. In addition, the insulating material M2 can be baked or cured by the second baking module V3 to form the insulating material layer 12, and the conductive material M3 can be baked or cured by the second baking module V3 to form the conductive particles 120. More particularly, referring to FIG. 2 and FIG. 5 to FIG. 7, firstly, the first portion of the insulation material M2 (such as PMMA, PP, PET, Mylar, polystyrene, polycarbonate or acrylate, etc.) can be formed on the metal material layer 11 by the first insulating material evaporating module V1, and the conductive material M3 (such as Cu, Al or In etc.) can be formed on the insulation material M2 by the conductive material evaporating module V2; next, the second portion of the insulation material M2 can be formed on the first portion of the insulation material M2 to cover the conductive material M3 by the insulating material evaporating module V1; then the insulating material M2 can be baked or cured by the second baking module V3 to form the insulating material layer 12; and then the conductive material M3 can be baked or cured by the second baking module V3 to form the conductive particles 120. That is to say, the plurality of conductive particles 120 can be randomly distributed in one of the first material layer L1 and the second material layer L2. However, it is not meant to limit the scope of the present disclosure.

It should be noted that the conductive particles 120 can be used as the evaporating material, and the material of the conductive particle can be a nanoparticle or an irregularly shaped particle with low melting point and high surface energy, before the conductive particles are mixed in one of the first material layer and the second material layer. Specifically, the melting point of the conductive particles 120 can be effectively decreased due to the high surface energy provided by the conductive particles 120. For example, the material of the conductive particle 120 can be any metal or alloy with low melting point (such as In metal or In alloy, etc.)

Figure 5:
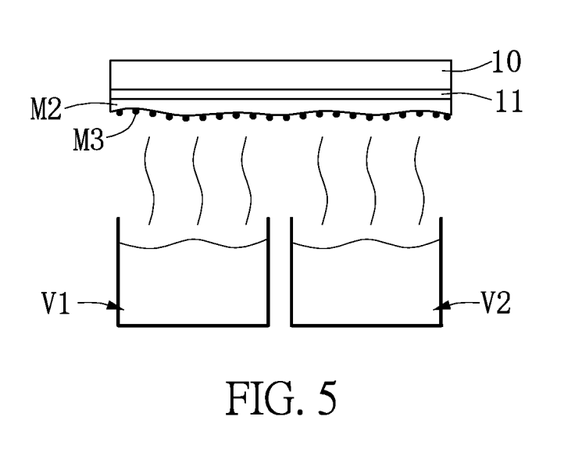
FIG. 5 shows a schematic view of the method for manufacturing the thin film capacitor for forming a first portion of an insulating material and an conductive material according to the first embodiment of the present disclosure.

It should be noted that the conductive particles 120 are transformed to a molten state heated by an electrical resistance heater or a beam heater, and the conductive particles 120 in the molten state are compressed into the spherical structure or the sphere-like structure because of its low melting point and high surface energy as shown in FIG. 5. In other words, the conductive particles 120 can be heated at a temperature that is smaller than the degradation temperature of polymers, therefore to form a spherical structure or a sphere-like structure with low melting point and high surface energy. Accordingly, the conductive particles 120 with high surface energy as well as the spherical structure or the sphere-like structure contributes to increasing the dielectric constant or the dielectric coefficient of the multilayer stacked structure 1.

It should be noted that "the size of the conductive particles 120" and "the percentage of the conductive particles 120 in the insulating material layer 12" can be determined by the evaporation quantity of the insulating material M2 and the conductive material M3 when the insulating material M2 and the conductive material M3 are co-evaporated as shown in FIG. 6 and FIG. 7. For example, the evaporation quantity of the insulating material M2 would be affected by the opening size of the evaporation vessel that is used for containing the insulating material M2, and the evaporation quantity of the conductive material M3 would be affected by the opening size of the evaporation vessel that is used for containing the conductive material M3. Furthermore, the ratio of the insulating material M2 to the conductive material M3 can be determined by the impedance value of the insulating material layer 12. For example, before the impedance value of the insulating material layer 12 is drastically decreased, the ratio of the conductive material M3 to the insulating material M2 would be at the maximum.

For example, as shown in FIG. 8, each of the terminal electrode structures 2 includes a first enclosing layer 21 for enclosing the side portion 20P of the multilayer stacked structure 1, a second enclosing layer 22 for enclosing the first enclosing layer 21, and a third enclosing layer 23 for enclosing the second enclosing layer 22. In addition, the first enclosing layer 21, the second enclosing layer 22 and the third enclosing layer 23 respectively are a silver layer, a nickel layer and a tin layer, but it is not meant to limit the scope of the present disclosure. For example, each of the terminal electrode structures 2 can only include one enclosing layer instead of three enclosing layers.

Figure 9:
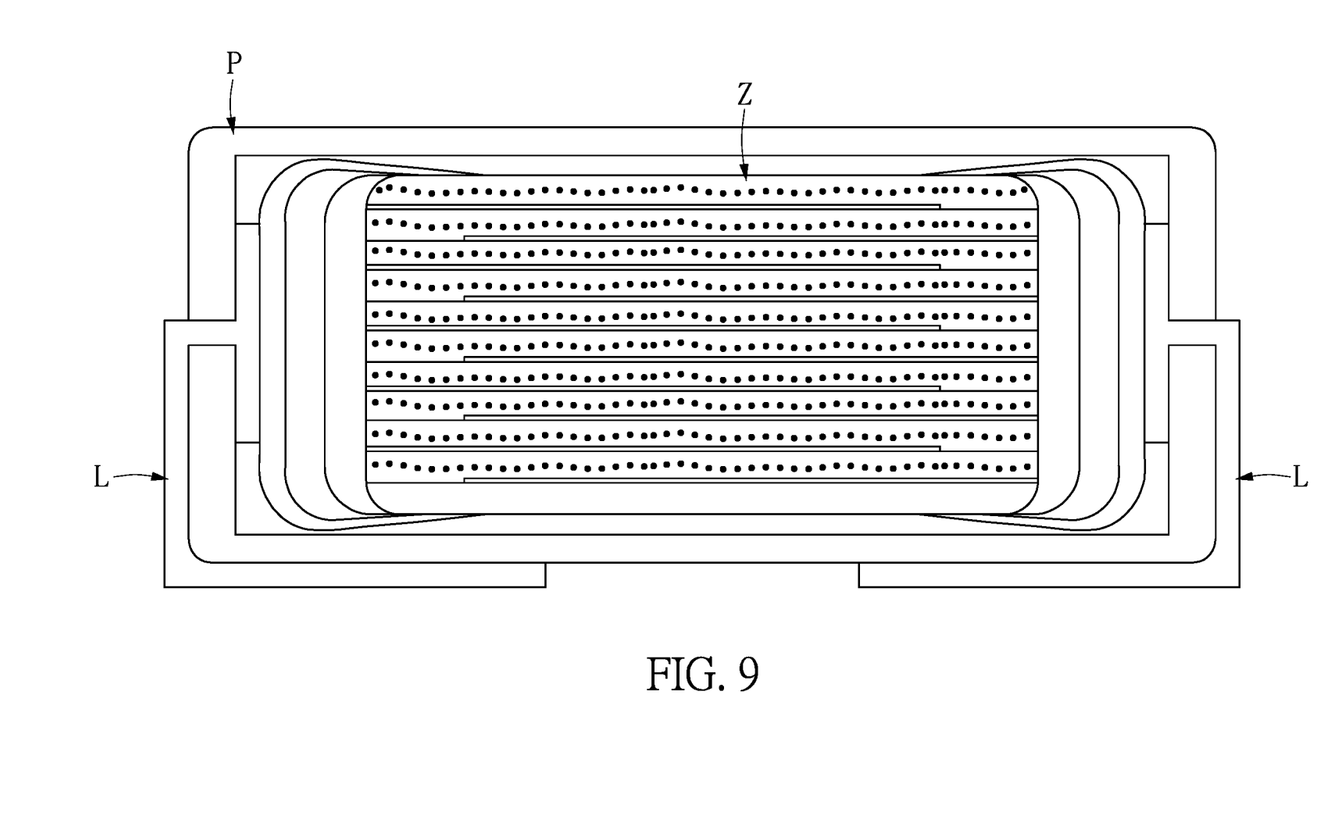
FIG. 9 shows a schematic view of a thin film capacitor package structure according to the first embodiment of the present disclosure.
Figure 10:
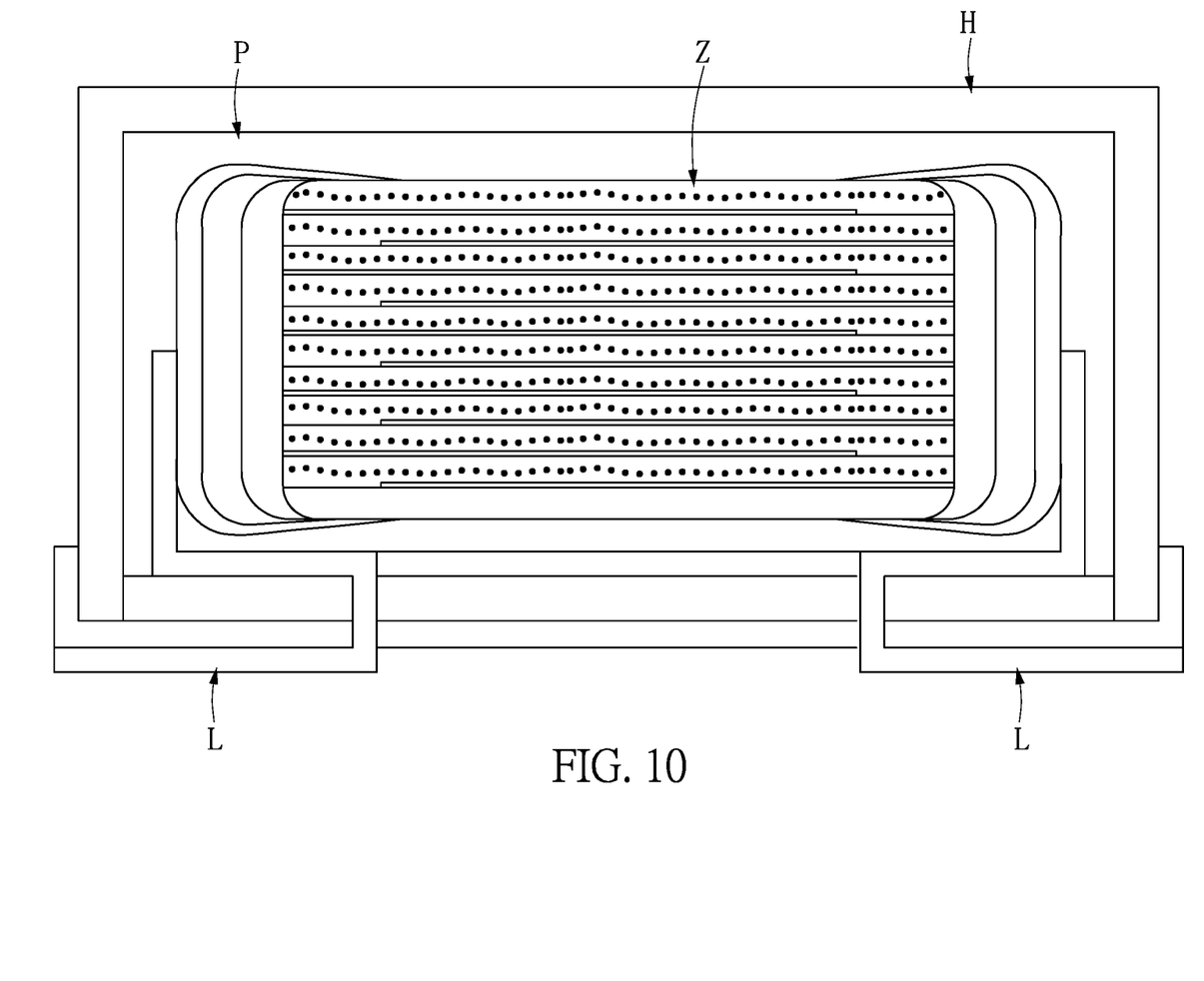
FIG. 10 shows a schematic view of another thin film capacitor package structure according to the first embodiment of the present disclosure.

For example, referring to FIG. 8 and FIG. 9, the thin film capacitor Z can be enclosed by a package body P (such as an insulation package body) in advance, and then two conductive pins L electrically contacting the thin film capacitor Z are extended from the thin film capacitor Z to the exterior of the package body P so as to complete a thin film capacitor package structure. In addition, for another example, referring to FIG. 8 and FIG. 10, the thin film capacitor Z can be enclosed by a package body P (such as an insulation package body) in advance and the thin film capacitor Z with the package body P is received inside a metal casing H (such as an aluminum casing), and then two conductive pins L electrically contacting the thin film capacitor Z are extended from the thin film capacitor Z to the exterior of the metal casing H so as to complete another thin film capacitor package structure. That is to say, the multilayer stacked structure 1 and the two terminal electrode structures 2 are enclosed by a package body P, and two conductive pins L respectively electrically contact the two terminal electrode structures 2 and are exposed from the package body P. However, the aforementioned description of the thin film capacitor package structure is merely an example and is not meant to limit the instant disclosure.

It should be noted that the first baking module F2 and the second baking module V3 can be omitted in the first embodiment. That is to say, the metal material layer forming device F includes a metal material forming module F1 for directly forming the metal material layer 11, and the co-evaporation device V includes an insulating material evaporating module V1 for directly forming the insulating material layer 12 and a conductive material evaporating module V2 for directly forming the conductive particles 120

Second Embodiment

Referring to FIG. 11 to FIG. 16, the second embodiment of the present disclosure provides a device for manufacturing a multilayer stacked structure and a method for manufacturing a thin film capacitor. Comparing FIG. 11 to FIG. 16 with FIG. 2 to FIG. 7, the difference between the second embodiment and the first embodiment is as follows.

Figure 11:
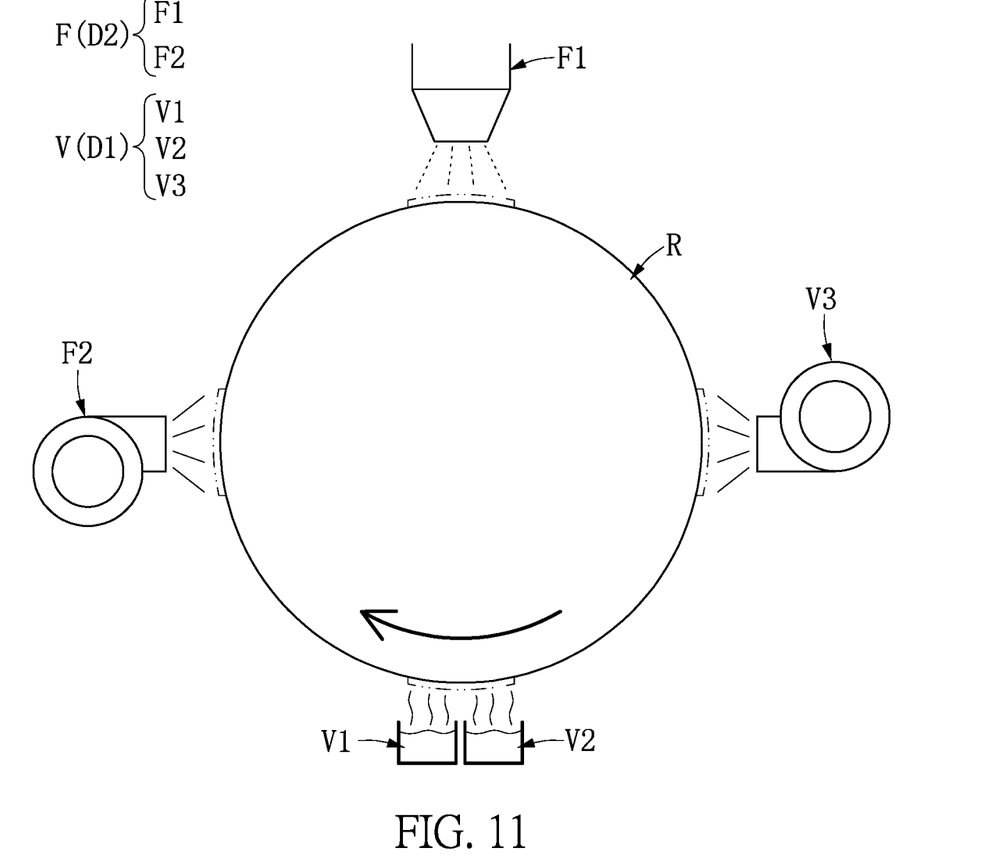
FIG. 11 shows a schematic view of a device for manufacturing a multilayer stacked structure according to a second embodiment of the present disclosure.
Figure 12:
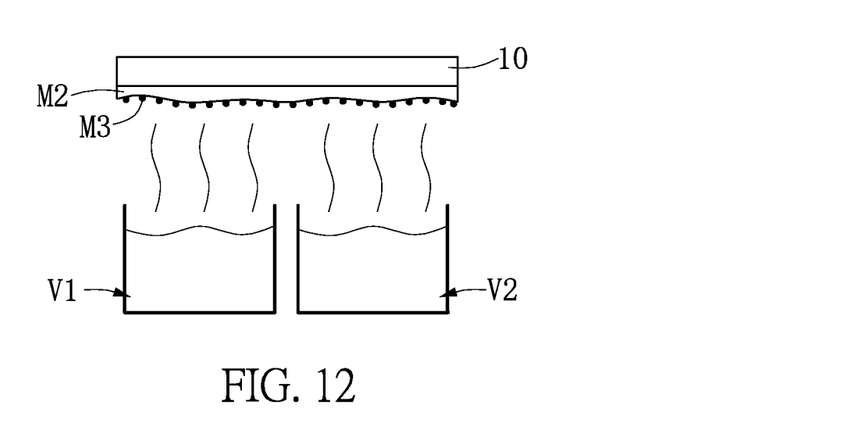
FIG. 12 shows a schematic view of the method for manufacturing the thin film capacitor for forming a first portion of an insulating material and a conductive material according to the second embodiment of the present disclosure.
Figure 13:
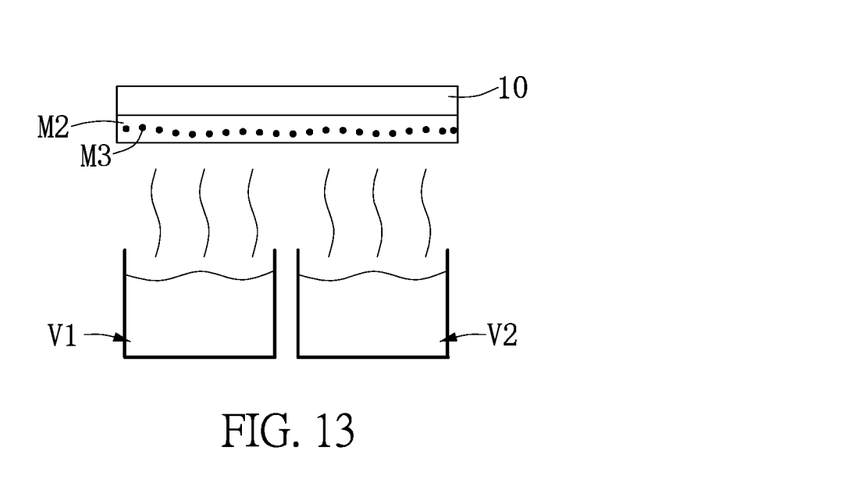
FIG. 13 shows a schematic view of the method for manufacturing the thin film capacitor for forming a second portion of the insulating material according to the second embodiment of the present disclosure.
Figure 14:
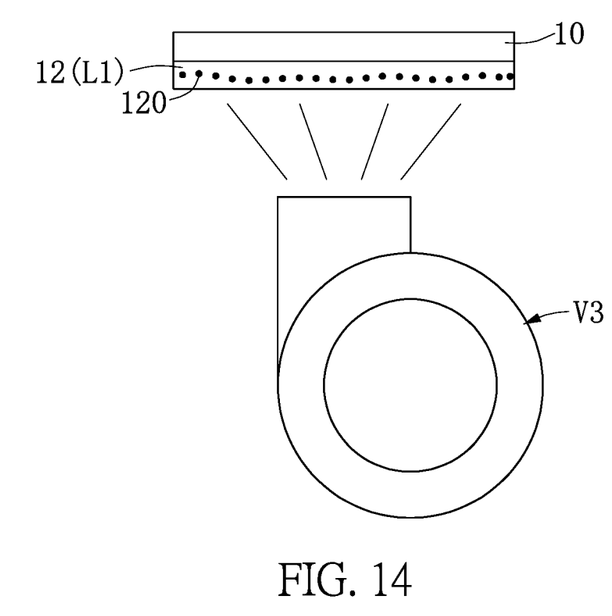
FIG. 14 shows a schematic view of the method for manufacturing the thin film capacitor for forming an insulating material layer having a plurality of conductive particles mixed therein according to the second embodiment of the present disclosure.
Figure 15:
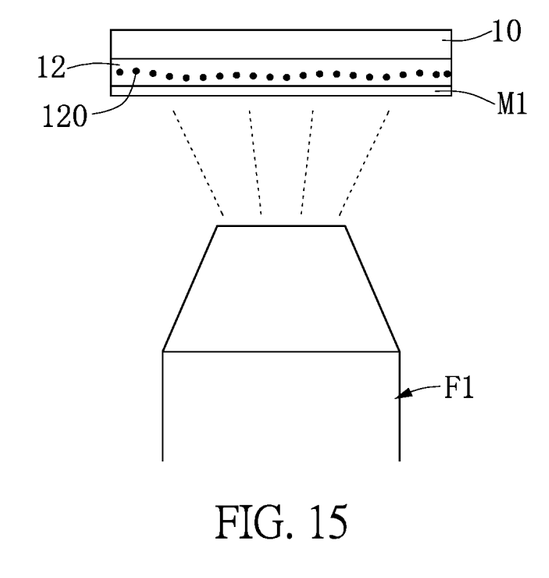
FIG. 15 shows a schematic view of the method for manufacturing the thin film capacitor for forming a metal material according to the second embodiment of the present disclosure.
Figure 16:
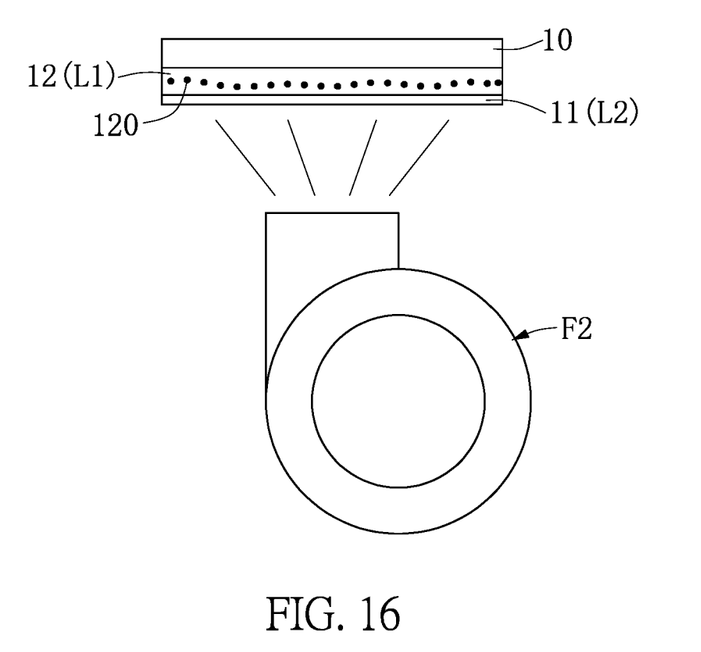
FIG. 16 shows a schematic view of the method for manufacturing the thin film capacitor for forming a metal material layer according to the second embodiment of the present disclosure.

Firstly, in the second embodiment, the first material layer L1 may be an insulating material layer 12 having a plurality of conductive particles 120 randomly distributed therein, and the second material layer L2 may be a metal material layer 11. In addition, the first material layer forming device D1 may be the sequential evaporation device V, and the second material layer forming device D2 may be a metal material layer forming device F for forming the metal material layer 11. Moreover, the insulating material layer 12 can be formed by the insulating material M2 provided by the co-evaporation device V, and the conductive particles 120 can be formed by the conductive material M3 provided by the co-evaporation device V.

Furthermore, in the second embodiment, the co-evaporation device V includes an insulating material evaporating module V1 for providing the insulating material M2, a conductive material evaporating module V2 for providing the conductive material M3, and a second baking module V3 adjacent to the insulating material evaporation module V1 and the conductive material evaporation module V2. In addition, the insulating material M2 can be baked or cured by the second baking module V3 to form the insulating material layer 12, and the conductive material M3 can be baked or cured by the second baking module V3 to form the conductive particles 120. More particularly, referring to FIG. 11 to FIG. 14, firstly, the first portion of the insulation material M2 (such as PMMA, PP, PET, Mylar, polystyrene, polycarbonate or acrylate, etc.) can be formed on the carrier substrate 10 by the insulating material evaporating module V1, and the conductive material M3 (such as Cu, Al or In etc.) can be formed on the insulation material M2 by the conductive material evaporating module V2; next, the second portion of the insulation material M2 can be formed on the first portion of the insulation material M2 to cover the conductive material M3 by the insulating material evaporating module V1; and then the insulating material M2 can be baked or cured by the second baking module V3 to form the insulating material layer 12, and the conductive material M3 can be baked or cured by the second baking module V3 to form the conductive particles 120. However, it is not meant to limit the scope of the present disclosure.

Moreover, in the second embodiment, the metal material layer forming device F includes a metal material forming module F1 for providing a metal material M1 and a first baking module F2 adjacent to the metal material forming module F1, and the metal material M1 can be baked or cured by the first baking module F2 to form the metal material layer 11. More particularly, referring to FIG. 11, FIG. 15 and FIG. 16, the metal material M1 (such as Cu or Al, etc.) is formed on the insulating material layer 12 by the metal material forming module F1, and then the metal material M1 is baked by the first baking module F2 to form the metal material layer 11. It should be noted that the metal material forming module F1 can generate the metal material M1 by coating, spraying or printing, but it is not meant to limit the scope of the present disclosure.

It should be noted that the first baking module F2 and the second baking module V3 can be omitted in the second embodiment. That is to say, the metal material layer forming device F includes a metal material forming module F1 for directly forming the metal material layer 11, and the co-evaporation device V includes an insulating material evaporating module V1 for directly forming the insulating material layer 12 and a conductive material evaporating module V2 for directly forming the conductive particles 120.

It should be noted that "the co-evaporation device V" is exemplified as an example in the first embodiment and the second embodiment, but it is not meant to limit the scope of the present disclosure. For instance, the co-evaporation can also be replaced by a sequential evaporation device. In other words, one of the first material layer forming device D1 and the second material layer forming device D2 can be the co-evaporation device or the sequential evaporation device according to the user requirement. If the co-evaporation device V is used, the co-evaporation device can concurrently provide the insulating material M2 and the conductive material M3 by co-evaporating for forming one of the first material layer and the second material layer. If the sequential evaporation device is used, the sequential evaporation device can provide the insulating material M2 and the conductive material M3 in sequence by sequential evaporating for forming one of the first material layer L1 and the second material layer L2.

In conclusion, the dielectric coefficient or the dielectric constant of the multilayer stacked structure 1 and the thin film capacitor Z can be increased, by matching the features of "one of the first material layer L1 and the second material layer L2 has a plurality of conductive particles 120 randomly distributed therein" and "the conductive particles 120 are heated to form a spherical structure or a sphere-like structure with low melting point and high surface energy at a temperature that is smaller than the degradation temperature of polymers."

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A method for manufacturing a thin film capacitor, comprising:

providing a carrier substrate;

forming a plurality of first material layers and a plurality of second material layers that are alternately stacked on top of one another and disposed on the carrier substrate to form a multilayer stacked structure; and forming two terminal electrode structures for respectively enclosing two opposite side portions of the multilayer stacked structure;

wherein each first material layer is formed by a first material layer forming device, and each second material layer is formed by a second material layer forming device;

wherein one of the first material layer and the second material layer has a plurality of conductive particles randomly distributed therein, the conductive particles have a low melting point and high surface energy and are heated to form a spherical structure or a sphere-like structure at a temperature that is smaller than a degradation temperature of polymers of the one of the first material layer and the second material layer that has the plurality of conductive particles; and wherein the material of the conductive particle is a nanoparticle or an irregularly shaped particle with low melting point and high surface energy before the conductive particles are mixed in one of the first material layer and the second material layer; wherein the conductive particles are transformed to a molten state heated by an electrical resistance heater or a beam heater, and the conductive particles in the molten state are compressed into the spherical structure or the sphere-like structure because of its low melting point and high surface energy.

2. The method of claim 1, wherein the one of the first material layer forming device and the second material layer forming device is a sequential evaporation device or a co-evaporation device, the co-evaporation device concurrently provides an insulating material of the one of the first material layer and the second material layer and a conductive material to be formed into the conductive particles by co-evaporating for forming the one of the first material layer and the second material layer, and the sequential evaporation device provides the insulating material and the conductive material in sequence by sequential evaporating for forming the one of the first material layer and the second material layer.

3. The method of claim 2, wherein the first material layer is a metal material layer, and the second material layer is an insulating material layer having a plurality of conductive particles mixed therein, wherein the first material layer forming device is a metal material layer forming device for forming the metal material layer, the second material layer forming device is the co-evaporation device, the insulating material layer is formed by the insulating material that is provided by the co-evaporation device, and the conductive particles are formed by the conductive material that is provided by the co-evaporation device.

4. The method of claim 3, wherein the metal material layer forming device includes a metal material forming module for providing a metal material and a first baking module adjacent to the metal material forming module, and the metal material is baked by the first baking module to form the metal material layer; wherein the co-evaporation device includes an insulating material evaporating module for providing the insulating material, a conductive material evaporating module for providing the conductive material, and a second baking module adjacent to the insulating material evaporating module and the conductive material evaporating module; the insulating material is baked by the second baking module to form the insulating material layer, and the conductive material is baked by the second baking module to form the conductive particles; wherein the size of the conductive particles and the percentage of the conductive particles in the insulating material layer are determined by the evaporation quantity of the insulating material and the conductive material when co-evaporating the insulating material and the conductive material.

5. The method of claim 3, wherein the metal material layer forming device includes a metal material forming module for forming the metal material layer, and the co-evaporation device includes an insulating material evaporating module for forming the insulating material layer, and a conductive material evaporating module for forming the conductive particles, wherein the size of the conductive particles and the percentage of the conductive particles in the insulating material layer are determined by the evaporation quantity of the insulating material and the conductive material when co-evaporating the insulating material and the conductive material.

6. The method of claim 2, wherein the first material layer is an insulating material layer having a plurality of conductive particles mixed therein, and the second material layer is a metal material layer, wherein the first material layer forming device is the co-evaporation device, the insulating material layer is formed by the insulating material provided by the co-evaporation device, and the conductive particles are formed by the conductive material provided by the co-evaporation device, and the second material layer forming device is a metal material layer forming device for forming the metal material layer.

* * * * *